United States Patent [19]

Fulford, Jr. et al.

[11] Patent Number: 5,767,000

[45] Date of Patent: Jun. 16, 1998

[54] METHOD OF MANUFACTURING SUBFIELD CONDUCTIVE LAYER

[75] Inventors: H. Jim Fulford, Jr.; Robert Dawson; Fred N. Hause; Basab Bandyopadhyay, all of Austin; Mark W. Michael, Cedar Park; William S. Brennan, Austin, all of Tex.

[73] Assignee: Advanced Micro Devices, Inc., Sunnyvale, Calif.

[21] Appl. No.: 655,243

[22] Filed: Jun. 5, 1996

[51] Int. Cl.$^6$ .................. H01L 21/76; H01L 21/74
[52] U.S. Cl. .................. 438/433; 438/298; 438/450; 438/526
[58] Field of Search .................. 437/69, 29, 70; 148/DIG. 117, DIG. 85, DIG. 86; 438/207, 225, 298, 433, 450, 229, 230, 222, 526

[56] References Cited

U.S. PATENT DOCUMENTS

| | | |
|---|---|---|
| 4,493,740 | 1/1985 | Komeda . |
| 4,653,177 | 3/1987 | Lebowitz et al. . |
| 4,987,093 | 1/1991 | Teng et al. . |
| 4,994,407 | 2/1991 | Custode et al. . |
| 5,141,882 | 8/1992 | Komori et al. . |
| 5,173,438 | 12/1992 | Sandhu . |
| 5,212,111 | 5/1993 | Doan et al. . |
| 5,266,510 | 11/1993 | Lee . |
| 5,342,803 | 8/1994 | Shimoji . |
| 5,372,963 | 12/1994 | Mori . |
| 5,401,671 | 3/1995 | Komori et al. . |
| 5,405,788 | 4/1995 | Manning et al. . |
| 5,468,677 | 11/1995 | Jun . |
| 5,529,948 | 6/1996 | Lur et al. . |
| 5,624,859 | 4/1997 | Liu et al. . |

*Primary Examiner*—George R. Fourson
*Attorney, Agent, or Firm*—Kevin L. Daffer; Conley, Rose & Tayon

[57] ABSTRACT

A subfield conductive layer is provided, wherein a conductive layer is implanted beneath and laterally adjacent a field dielectric. The subfield conductive layer is placed within the silicon substrate after the field dielectric is formed. The conductive layer represents a buried interconnect which resides between isolated devices. The buried interconnect, however, is formed using high energy ion implant through a field dielectric formed either by LOCOS or shallow trench isolation techniques. The buried interconnect, or conductive layer, resides and electrically connects source and drain regions of two isolated devices.

10 Claims, 3 Drawing Sheets

METHOD OF MANUFACTURING SUBFIELD CONDUCTIVE LAYER

BACKGROUND OF THE INVENTION

1. Field of the Invention

This invention relates to semiconductor fabrication and more particularly to a subfield conductive layer and method of manufacturing the subfield conductive layer between source/drain implant regions.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation and interconnect routing technologies are two of many critical aspects involved in fabricating a functional integrated circuit.

A popular isolation technology used in metal oxide semiconductor ("MOS") fabrication involves the process of local oxidation of silicon, or "LOCOS". LOCOS process involves oxidizing field regions between devices. The oxide grown in field regions are termed field oxide, wherein field oxide is grown during the initial stages of integrated circuit fabrication, i.e., before source and drain implants are placed in device active areas. By growing a thick field oxide in field regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends laterally as a bird's-beak structure. In many instances, the bird's-beak structure can unacceptably encroach into the device active area. Second, the pre-implanted channel-stop dopant oftentimes redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions.

Many of the problems associated with LOCOS technology are alleviated by an isolation technique known as the "shallow trench process". Despite advances made to decrease bird's-beak, channel-stop encroachment and non-planarity, it appears that LOCOS technology remains inadequate for deep submicron MOS technologies. The shallow trench process is better suited for isolating densely spaced active areas having field regions less than, for example, one micron in lateral dimension.

The trench process involves the steps of etching a silicon substrate surface to a relatively shallow depth, e.g., between 0.2 to 0.5 microns, and then refilling the shallow trench with a deposited dielectric. Some trench processes include an interim step of growing oxide on trench walls prior to the trench bein g filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

While the trench isolation process has many advantages, there remain many problems associated with the formation of the trench and, specifically, filling of the trench. Conventional chemical vapor deposition (CVD) processes exhibit a tendency to form cusps and/or voids at the midline between closely spaced active areas hereinafter termed "silicon mesas". Those voids can lead to reliability problems and inadequate isolation performance. The planarization technique used to subsequently remove the fill dielectric from the upper surface of silicon mesas may, unfortunately, overetch the fill dielectric in the isolation areas relative to the silicon mesas. Any exposure at the silicon mesa corner or sidewalk causes inappropriate fringing field effects and/or parasitic sidewalk conduction.

Accordingly, most conventional integrated circuits employ either LOCOS or shallow trench isolation, depending upon the layout density requirements of the circuit. In addition, many integrated circuits purposefully circumvent isolation between specific devices by routing an interconnect line between devices over the grown or deposited field oxide. The interconnect generally contacts a source (or drain) region on one device to the source (or drain) region on another device. The interconnect, generally made of a conductive material such as a refractory metal and/or polysilicon serves as a conductor residing within the topography of the integrated circuit.

An interconnect extending along the topography of the integrated circuit, between devices, adds to the non-planarity of the overall structure. Generally speaking, a LOCOS field oxide extends a substantial amount from the substrate, over which an interconnect only adds to that amount. A cumulative effect of a thick field oxide and an overlying interconnect worsens the non-planarity of the resulting semiconductor topological surface. An overlying interlevel dielectric must be considerably planarized in order to achieve accurate patterning of subsequent levels of interconnect. It would therefore be desirable to produce a conductive layer which does not reside in the semiconductor topography. That is, the desired conductor must be one which is not formed on top of the field oxide. Accordingly, the desired conductor must not add to the non-planarity of the overall circuit. Further, the desired conductor must be formed entirely within the normal fabrication flow necessary to manufacture an MOS circuit.

SUMMARY OF THE INVENTION

Problems outlined above are in large part solved by a subfield conductive layer of the present invention. That is, the subfield conductive layer is one which is formed after the field oxide is present. The subfield conductive layer is formed by implanting dopants through either a thermally grown field oxide or a field oxide deposited into a shallow trench. Accordingly, the subfield conductive layer can be formed in MOS integrated circuits employing either LOCOS or shallow trench isolation techniques.

The subfield conductive layer is advantageously used to interconnect what would normally be isolated devices. In lieu of metal or polysilicon interconnects which reside over the field oxide, the subfield conductive layer is formed entirely within the silicon substrate, and resides beneath and laterally adjacent the field oxide. As defined herein, field oxide is one having insulative characteristics, and is interchangeably denoted as a field dielectric. The conductive layer is formed by implanting high energy ions through the field dielectric, regardless of the form taken by that field dielectric. Resulting from a masking layer which covers the semiconductor topography except for the field regions, high energy implantation at specified dosages presents a layer of dopant underneath and adjacent to the field dielectric. Implantation or diffusion of source/drain regions occur after the conductive layer is formed. The source/drain regions are fashioned so as to intermingle with and be a part of the conductive layer opposing ends. The selected source/drain regions are of the same conductivity type as the dopants within the conductive layer. For example, select source/drain regions as well as the conductive layer comprise n-type dopants or, alternatively, select source/drain regions and conductive layer dopants can be p-type. Mutuality of dopants within the source/drain regions interconnected by the conductive layer causes formation of an electrical path across the conductive layer, underneath the field dielectric.

Broadly speaking, the present invention contemplates a method for forming a conductive layer. The method includes the steps of providing an integrated circuit topography having a field dielectric interposed between a pair of active areas. A masking layer is applied over the active areas a spaced distance from the field dielectric to form a partially masked integrated circuit topography. First dopant ions are implanted entirely across the partially masked integrated circuit topography to form a conductive layer in regions below and adjacent to the field dielectric. Second dopant ions are then implanted into source and drain regions configured adjacent to the field dielectric. The spaced distance between the masking layer and the field dielectric is preferably between 0.2 to 2.0 microns. First dopant ions are preferably implanted at a concentration between $1\times10^{15}$ to $1\times10^{16}$ ions/cm$^2$ at an energy exceeding 350 keV. Preferably, implantation energy through the field dielectric exceeds 1 MeV.

The present invention further contemplates a buried conductor. The buried conductor comprises a conductivity region within a silicon substrate arranged beneath and laterally adjacent to a field dielectric disposed upon the silicon substrate topography. Dopants are implanted into the conductivity region to form the buried conductor. The dopants are of opposite conductivity type than the conductivity of the silicon substrate (i.e., substrate well or substrate bulk areas regions). A portion of the source region and a portion of the drain region is shared by the conductivity region. More specifically, the conductivity region extends between portions of the source and drain regions within select metal oxides semiconductor (MOS) devices. The buried conductor typically comprises a sheet resistance greater than 70 ohms/squre, or between 70–100 ohms/square.

BRIEF DESCRIPTION OF THE DRAWINGS

Other objects and advantages of the invention will become apparent upon reading the following detailed description and upon reference to the accompanying drawings in which.

Figure 1:
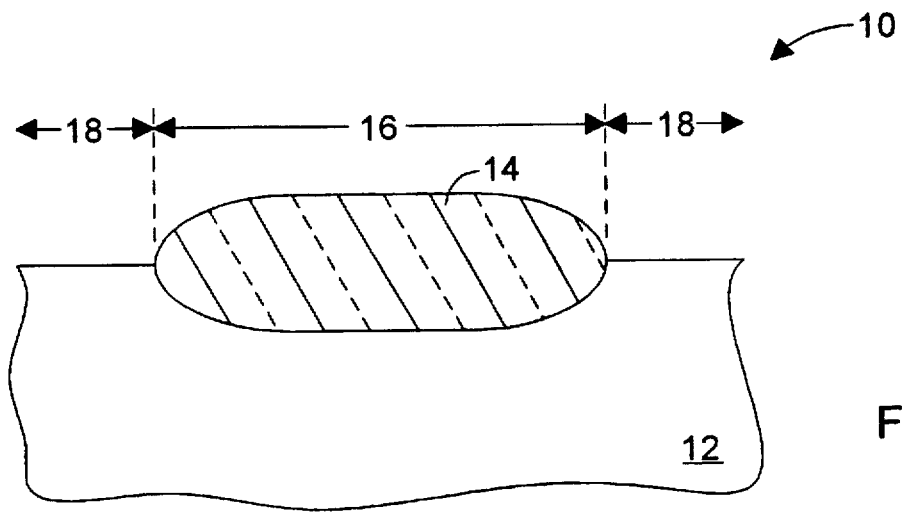
FIG. 1 is a partial cross-sectional view of an integrated circuit topography which includes a thermally grown field dielectric interposed between a pair of active areas.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to drawings, FIG. 1 illustrates a partial cross-sectional view of an integrated circuit topography 10. Topography 10 includes a silicon substrate 12 and a thermally grown field dielectric 14 fashioned in accordance with LOCOS techniques. Field dielectric 14 is grown by exposing silicon substrate 12 within field region 16 to a dry oxygen or steam ambient. Select exposure of field region 16 is achieved by placing a masking layer (not shown) over active regions 18. The various masking materials used to selectively expose field regions 16 for LOCOS processing are known.

Field dielectric 14 is thermally grown to a thickness between 0.1 to 1.0 microns using, for example, a steam or dry ambient with ambient temperatures elevated to approximately 800°–1000° C. for 2–4 hours. Preparations may occur on the upper surface of substrate 12 so as to partially or fully recess field dielectric 14 within substrate 12. Regardless of the various permutations from standard LOCOS process flow, the result is generally the same: to produce a thermally grown field dielectric 14 within field regions 16 to a thickness sufficient to minimize the likelihood of field inversion or channel formation within the field region.

Figure 2:
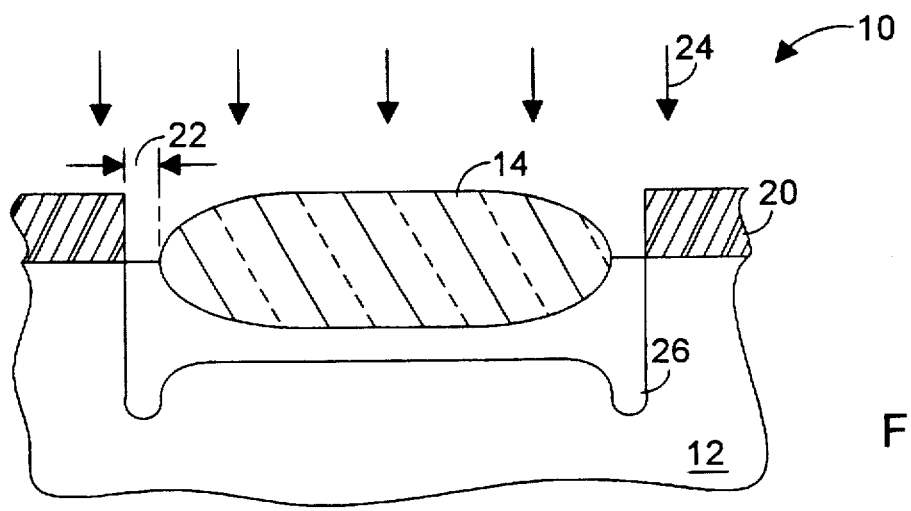
FIG. 2 illustrates, according to a first embodiment, a processing step subsequent to that of FIG. 1.

Referring to FIG. 2, a processing step subsequent to that of FIG. 1 is shown. Namely, FIG. 2 illustrates deposition of and subsequent patterning of a masking layer 20. The patterned masking layer 20 can suitably be produced from a photoresist material which is polymerized by exposure to ultraviolet light. Patterned masking layer 20 is formed over active regions 18 a spaced distance 22 from field dielectric 14. The formation of patterned masking layer 20 and achievement of spaced distance 22 is performed using generalized lithography steps. Patterned masking layer 20 can be achieved by using the same projection mask involved in exposing field region 16, the difference being a sizing of the projection mask to take into account spaced distance 22.

FIG. 2 further illustrates, after formation of patterned masking layer 20, implantation of ions 24 in all areas not covered by masking layer 20. Ions 24 are forwarded with sufficient energy to penetrate deep within substrate 12 in areas laterally adjacent to field dielectric 14. Ions 24 also penetrate through field dielectric 14 and reside within substrate 12 immediately beneath field dielectric 14. Accordingly, ions 24 are implanted to form a doped layer rendered conductive in regions below and adjacent field dielectric 14. Ions 24 can be either n-type ions (e.g., phosphorus or arsenic) or p-type ions (e.g., boron or boron difluoride). Regardless of the type chosen, ions 24 dopant type are opposite to the well region dopant or the starting material dopant of substrate 12. For example, if substrate 12 starting material or well area below field oxide 14 is a p-type substrate, then ions 24 are n-type ions.

Figure 3:
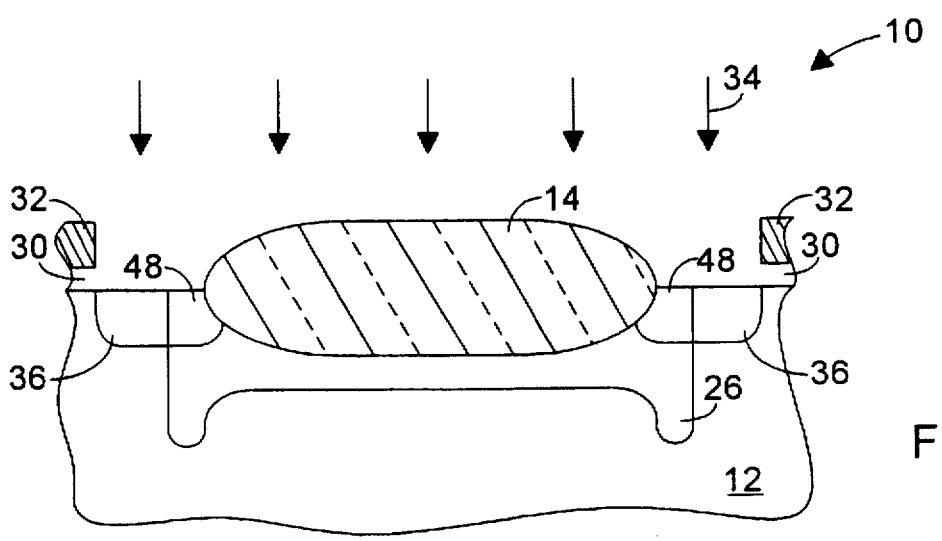
FIG. 3 illustrates, according to the first embodiment, a processing step subsequent to that of FIG. 2.

FIG. 3 illustrates a processing step subsequent to that shown in FIG. 2. In FIG. 3, patterned masking layer 20 is removed from active areas 18 to allow for subsequent processing within the active areas. More specifically, each active area 18 is adapted to receive a gate oxide 30 and a patterned polysilicon layer 32 patterned across a portion of gate oxide 30. If the ensuing device is a non-volatile memory, gate oxide 30 can be configured to include a tunnel oxide, while polysilicon layer 32 can comprise a floating gate and control gate.

In accordance with the self-aligned process, dopant ions 34 are forwarded to the integrated circuit topography 10. Dopant ions 34 penetrate into substrate 12 between polysilicon 32 and field dielectric 14 to form source and drain regions 36. Dopant ions 34 are forwarded at a concentration level necessary to heavily dope either n-type or p-type source and drain regions 36. Dopant ions 34 are forwarded at a higher dosage level and at lower energies than dopant ions 24. The dosages associates with dopant ions 24 are between $1 \times 10^{15}$ to $1 \times 10^{16}$ ions/cm$^2$ and at energies exceeding 350 keV, or in most instances exceeding 1 meV. The energy levels associated with dopant ions 34 are much less than that of dopant ions 24 since it is desired that dopant ions 34 not penetrate through field dielectric 14 or polysilicon 32. Dopant ions 34 are, however, of the same conductivity type as dopant ions 24. Mutual conductivity of ions 24 and 34 ensures a conductive region is formed between source and drain regions, across conductive layer 26.

Figure 4:
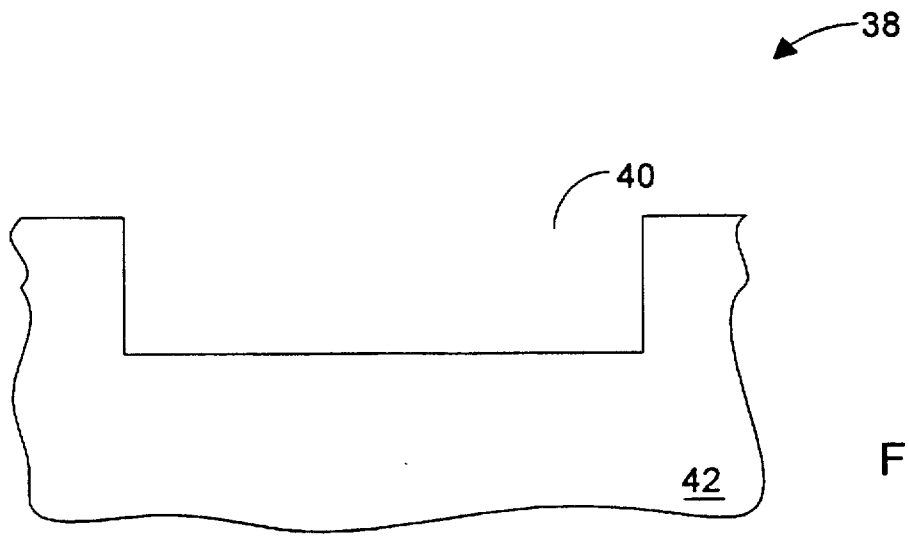
FIG. 4 is a partial cross-sectional view of an integrated circuit topography which includes a trench isolation region interposed between active areas.

Turning now to FIGS. 4–7, a sequence of processing steps associated with an alternative embodiment are shown. FIG. 4 illustrates the initial stages of a shallow trench isolation process, as opposed to the LOCOS process of FIGS. 1–3. FIG. 4 depicts an integrated circuit topography 38 which comprises a shallow trench 40 formed partially into silicon substrate 42. Shallow trench 40 is preferably etched into silicon substrate 42 to a depth of between 0.2 to 0.5 microns.

Figure 5:
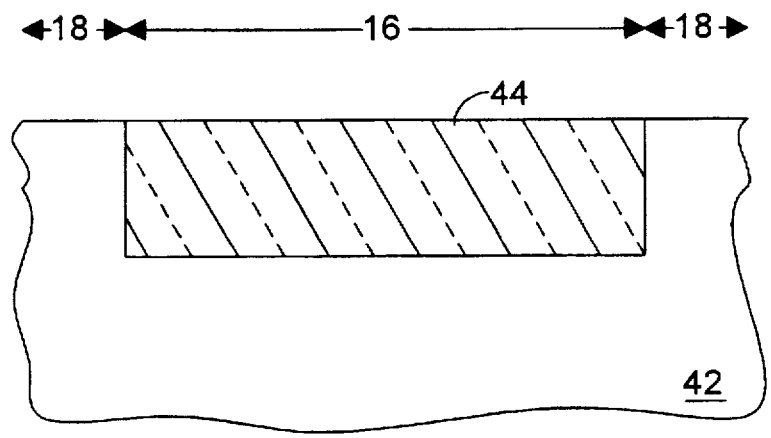
FIG. 5 illustrates, according to a second embodiment, a processing step subsequent to that of FIG. 4.

FIG. 5 illustrates a subsequent processing step to that of FIG. 4. Shown in FIG. 5 is a layer of dielectric material 44 CVD deposited within trench 40. CVD dielectric 44 is used to fill trench 40. The resulting surface is generally planarized back to the non-trenched surfaces of silicon substrate 42. Fill dielectric 44 is hereinafter referred to as a field dielectric interposed between active regions 18.

Figure 6:
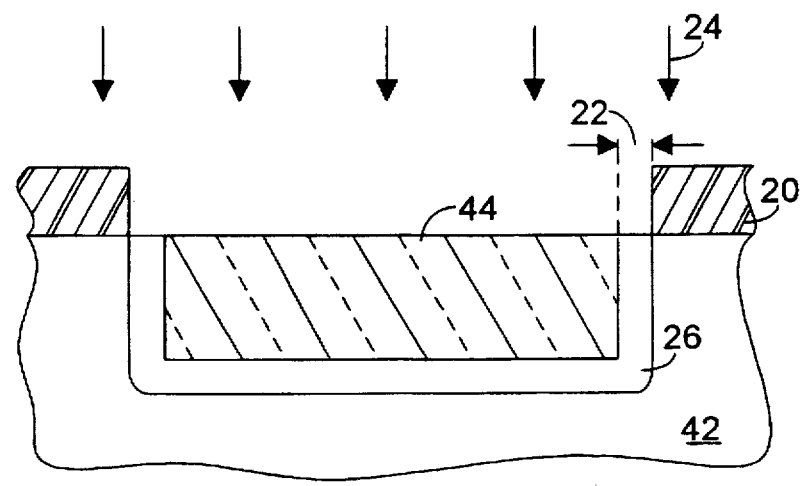
FIG. 6 illustrates, according to the second embodiment, a processing step subsequent to that of FIG. 5.

FIG. 6 illustrates processing step subsequent to FIG. 5. Dopant ions 24 are forwarded into silicon substrate 42 in areas not masked by patterned masking layer 20. Similar to patterned masking layer 20 shown in FIG. 2, patterned masking layer 20 shown in FIG. 6 is configured a spaced distance 22 from the outer perimeter of the field dielectric, either field dielectric 14 or 44. Dopant ions 24 are forwarded through field dielectric 44 with energy similar to the energy used to forward dopant ions 24 through field dielectric 14. Energy will vary depending upon the desired thickness of field dielectrics 44 and 14.

Conductive layer 26 is implanted at substantially equal depth across field dielectric 44. Further, proper sizing of patterned masking layer 20 ensures a proper width of conductive layer 26 at the lateral sidewall of fill dielectric 44. Conductive layer 26 width at the lateral sidewall is chosen to sufficiently match the depth at which conductive layer 26 extends beyond the bottom of fill dielectric 44. Accordingly, conductive layer 26 is of equal thickness at the lateral sides of fill dielectric 44 relative to the bottom of fill dielectric 44. Equal conductive layer thickness on the sides of and below field dielectrics 14 and 44 is necessary to ensure uniform conductivity of the buried conductor. Dosage of dopant ions 24 can be varied to change the conductivity of conductive layer 26. A heavier dosage will increase conductivity. In many instances, a resistor may be necessary between isolated devices, wherein conductive layer 26 can be doped to a specified resistance value.

Figure 7:
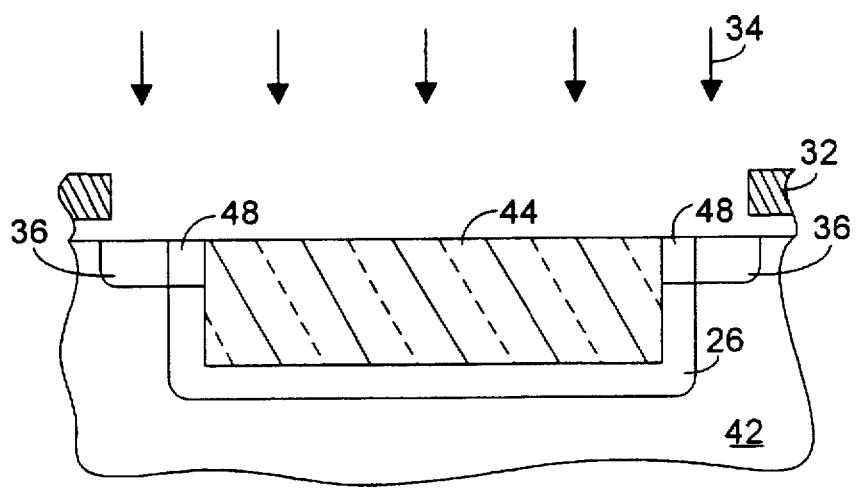
FIG. 7 illustrates, according to the second embodiment, a processing step subsequent to that of FIG. 6.

FIG. 7 illustrates a step subsequent to that of FIG. 6. Specifically, FIG. 7 demonstrates implant of dopant ions 34 into silicon substrate 42 in all regions not masked by polysilicon 32 and field dielectric 44. Dopant 34 within silicon substrate 42 allows formation of source and drain regions 36, a portion of which are intermingled with distal ends of conductive layer 26. Thus, a portion of a source region and a portion of a drain region, noted by reference numeral 48, are shared by the conductivity region associated with conductive layer 26. Shared region 48 is also shown in reference to the alternative embodiment illustrated in FIG. 3. Dopant ions 34 are forwarded with the dosage necessary to form heavily doped source and drain regions 36, but with lesser energy than that of dopant ions 24. Source and drain regions do not extend beyond field dielectric 44, and are not forwarded with sufficient energy to penetrate through patterned polysilicon 32.

It would be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather a restrictive sense.

What is claimed is:

1. A method for forming a conductive layer, comprising:

providing an integrated circuit topography which includes a field dielectric interposed between a pair of active areas;

applying a masking layer over said active areas a spaced distance from said field dielectric to form a partially masked integrated circuit topography;

implanting first dopant ions entirely across said partially masked integrated circuit topography to form a conductive layer in regions below and adjacent to said field dielectric; and implanting second dopant ions of the same conductivity type as said first dopant ions into source and drain regions configured adjacent said field dielectric in electrical communication with said conductive layer.

2. The method as recited in claim 1, wherein said field dielectric comprises a thermally grown oxide.

3. The method as recited in claim 1, wherein said providing step comprises providing a silicon surface between said active areas, and then thermally growing an oxide upon said silicon surface.

4. The method as recited in claim 1, wherein said field dielectric comprises a trench formed within a substrate thereafter filled with a deposited oxide.

5. The method as recited in claim 1, wherein said providing step comprises etching a substantially planar silicon surface to form a trench therein, and then filling said trench with a chemical vapor deposited oxide.

6. The method as recited in claim 1, wherein said applying step comprises depositing a photoresist layer across said integrated circuit topography and then selectively removing said photoresist layer from said field dielectric.

7. The method as recited in claim 1, wherein said spaced distance is 0.2 to 2.0 microns.

8. The method as recited in claim 1, wherein the step of depositing said first dopant ions comprises implanting at a concentration between $1 \times 10^{15}$ to $1 \times 10^{16}$ ions/cm$^2$ and at an energy exceeding 350 keV.

9. The method as recited in claim 1, wherein said first dopant ions and said second dopant ions comprise n-type ions implanted into a p-type silicon substrate.

10. The method as recited in claim 1, wherein said first dopant ions and said second dopant ions comprise p-type ions implanted into an n-type silicon substrate.

* * * * *